(12) United States Patent
Yoon et al.

(10) Patent No.: US 9,219,208 B2
(45) Date of Patent: *Dec. 22, 2015

(54) LIGHT EMITTING DEVICE AND LIGHTING SYSTEM INCLUDING THE SAME

(71) Applicant: LG INNOTEK CO., LTD., Seoul (KR)

(72) Inventors: Yeo Chan Yoon, Seoul (KR); Sung Joo Oh, Seoul (KR); Jae Hwan Jung, Seoul (KR); Jin Seong Kim, Seoul (KR); Bong Kul Min, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/835,555

(22) Filed: Mar. 15, 2013

(65) Prior Publication Data

US 2014/0070249 A1 Mar. 13, 2014

(30) Foreign Application Priority Data

Sep. 13, 2012 (KR) .......................... 10-2012-0101819

(51) Int. Cl.
*H01L 33/62* (2010.01)
*H01L 25/16* (2006.01)

(52) U.S. Cl.
CPC .............. *H01L 33/62* (2013.01); *H01L 25/167* (2013.01); *H01L 2224/16* (2013.01); *H01L 2924/1301* (2013.01)

(58) Field of Classification Search
None
See application file for complete search history.

(56) References Cited

U.S. PATENT DOCUMENTS

| 7,180,099 | B2 | 2/2007 | Ogihara et al. | |
|---|---|---|---|---|
| 2014/0071689 | A1* | 3/2014 | Yoon et al. | 362/296.01 |
| 2014/0071700 | A1* | 3/2014 | Yoon et al. | 362/382 |

FOREIGN PATENT DOCUMENTS

| JP | 2006/066700 A | 3/2006 |
|---|---|---|
| JP | 2009/158656 A | 7/2009 |

OTHER PUBLICATIONS

4 European Search Report for Application EP 13 17 8622 dated Oct. 5, 2015.

* cited by examiner

*Primary Examiner* — Fernando L Toledo
*Assistant Examiner* — Valerie N Newton
(74) *Attorney, Agent, or Firm* — KED & Associates LLP

(57) ABSTRACT

A light emitting device according to the embodiment includes a body; a first lead electrode having a first bonding part and a second bonding part; a second lead electrode having a third bonding part and a fourth bonding part; a gap part between the first and second lead electrodes; a third lead electrode on a bottom surface of the body; a fourth lead electrode on the bottom surface of the body; a first connection electrode; a second connection electrode; a light emitting chip; and a first bonding member, wherein the gap part includes a first gap part disposed between the first and third bonding parts, and the first gap part includes first and second regions spaced apart from each other corresponding to a width of the third bonding part, and a third region connected to the first and second regions and disposed perpendicularly to the first and second regions.

20 Claims, 11 Drawing Sheets

LIGHT EMITTING DEVICE AND LIGHTING SYSTEM INCLUDING THE SAME

The present application claims priority under 35 U.S.C. §119(a) of Korean Patent Application No. 10-2012-0101819 filed on Sep. 13, 2012, which is hereby incorporated by reference in its entirety.

BACKGROUND

The embodiment relates to a light emitting device and a lighting system including the same.

Light emitting devices, for example, light emitting diodes (LEDs) are semiconductor devices that convert electric energy into light and extensively used as next-generation light sources in place of conventional fluorescent lamps and glow lamps.

Since the LED generates the light by using the semiconductor device, the LED may represent low power consumption as compared with the glow lamp that generates the light by heating tungsten or the fluorescent lamp that generates the light by urging ultraviolet ray, which is generated through the high-voltage discharge, to collide with a fluorescent substance.

In addition, the LED generates the light by using the potential gap of the semiconductor device, so the LED is advantageous as compared with conventional light sources in terms of life span, response characteristics and environmental-friendly requirement.

In this regard, various studies have been performed to replace the conventional light sources with the LEDs. The LEDs are increasingly used as light sources for lighting devices, such as various lamps used indoors and outdoors, liquid crystal displays, electric signboards, and street lamps.

SUMMARY

The embodiment provides a light emitting device having a novel structure.

The embodiment provides a light emitting device having a light emitting chip formed with an align mark.

The embodiment provides a light emitting device having a reflective resin layer disposed around a light emitting chip to cover a protective chip.

The embodiment provides a light emitting device including a first resin layer around a light emitting chip and a fluorescent layer on the light emitting chip.

According to the embodiment, there is provided a light emitting device including a body; a first lead electrode having a first bonding part on a top surface of the body and a second bonding part extending from the first bonding part; a second lead electrode having a third bonding part inside the first bonding part and a fourth bonding part corresponding to the second bonding part; a gap part between the first and second lead electrodes; a third lead electrode on a bottom surface of the body; a fourth lead electrode on the bottom surface of the body; a first connection electrode to connect the first lead electrode to the third lead electrode in the body; a second connection electrode to connect the second lead electrode to the third lead electrode in the body; a light emitting chip on the first bonding part of the first lead electrode and the third bonding part of the second lead electrode; and a first bonding member disposed among the light emitting chip, the first bonding part of the first lead electrode and the third bonding part of the second electrode, wherein the gap part includes a first gap part disposed between the first and third bonding parts, and the first gap part includes first and second regions spaced apart from each other corresponding to a width of the third bonding part and disposed in parallel to each other, and a third region connected to the first and second regions and disposed perpendicularly to the first and second regions.

According to the embodiment, there is provided a light emitting device including a body; a first lead electrode having a first bonding part on a top surface of the body and a second bonding part extending from the first bonding part; a second lead electrode having a third bonding part inside the first bonding part and a fourth bonding part corresponding to the second bonding part; a third lead electrode on a bottom surface of the body; a fourth lead electrode on the bottom surface of the body; a first connection electrode to connect the first lead electrode to the third lead electrode in the body; a second connection electrode to connect the second lead electrode to the third lead electrode in the body; a light emitting chip on the first bonding part of the first lead electrode and the third bonding part of the second lead electrode; a first bonding member disposed among the light emitting chip, the first bonding part of the first lead electrode and the third bonding part of the second electrode; and a protective chip on the second bonding part of the first lead electrode and the fourth bonding part of the second lead electrode, wherein the first lead electrode includes first to third recess parts disposed in regions corresponding to at least three corners of the light emitting chip, and the first to third recess parts have depths corresponding to an interval between one side of the light emitting chip and one side of the body adjacent to the one side of the light emitting chip.

DETAILED DESCRIPTION OF THE EMBODIMENTS

Figure 1:
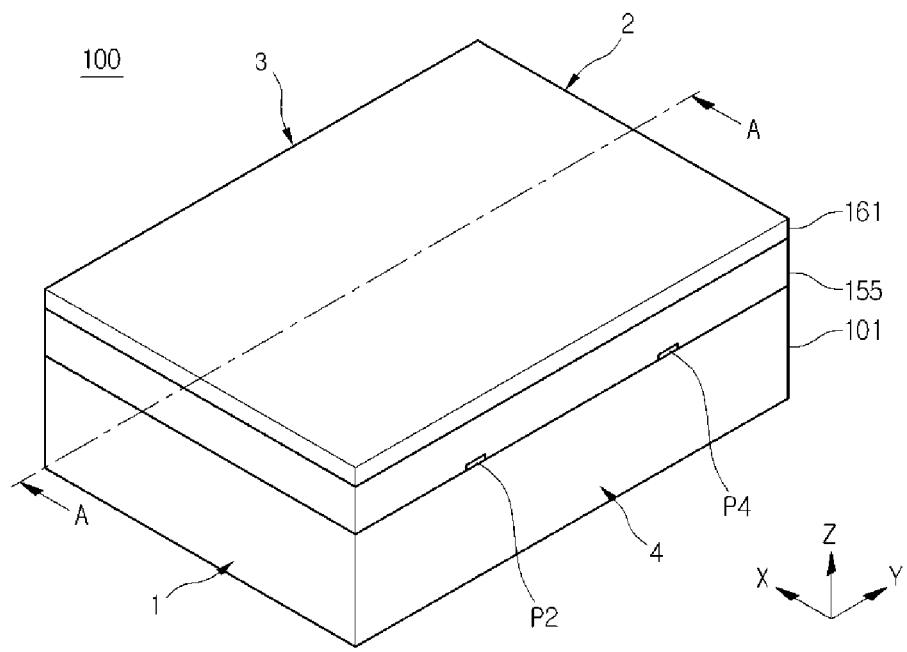
FIG. 1 is a perspective view showing a light emitting device according to the first embodiment.

Hereinafter, embodiments will be described in detail with reference to accompanying drawings so that those skilled in the art can easily work with the embodiments. However, the embodiments may not be limited to those described below, but have various modifications.

In the following description, when a predetermined part "includes" a predetermined component, the predetermined part does not exclude other components, but may further include other components unless otherwise indicated. In the description of the embodiments, it will be understood that when a layer, a film, a region, or a plate is referred to as being "on" another layer, another film, another region, or another plate, it can be "directly" or "indirectly" on the other layer, other film, other region, other plate, or one or more intervening layers may also be present. In contrast, when a part is referred to as being "directly on" another part, the intervening layer is not present.

The thickness and size of each layer shown in the drawings may be exaggerated, omitted or schematically drawn for the purpose of convenience or clarity. In addition, the size of elements does not utterly reflect an actual size. The same reference numbers will be assigned the same elements throughout the drawings.

Hereinafter, a light emitting device according to the first embodiment will be described with reference to FIGS. 1 to 7.

Figure 2:
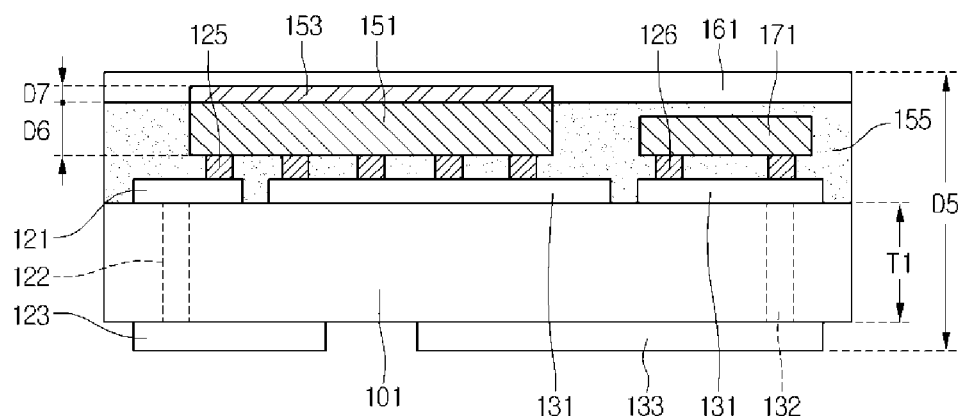
FIG. 2 is a side sectional view taken along line A-A of a light emitting device shown in FIG. 1.
Figure 3:
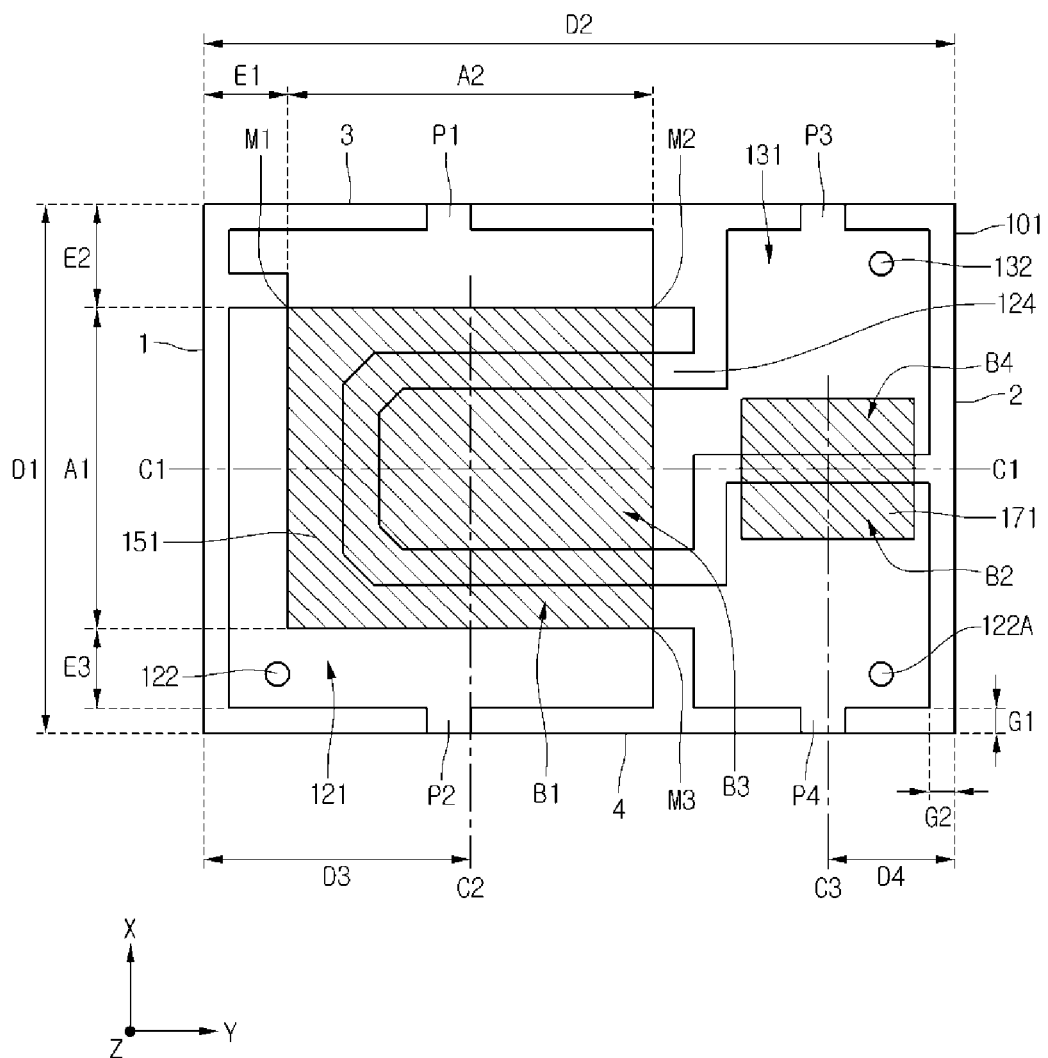
FIG. 3 is a plan view showing a light emitting chip and a protective chip mounted on a body shown in FIG. 1.
Figure 4:
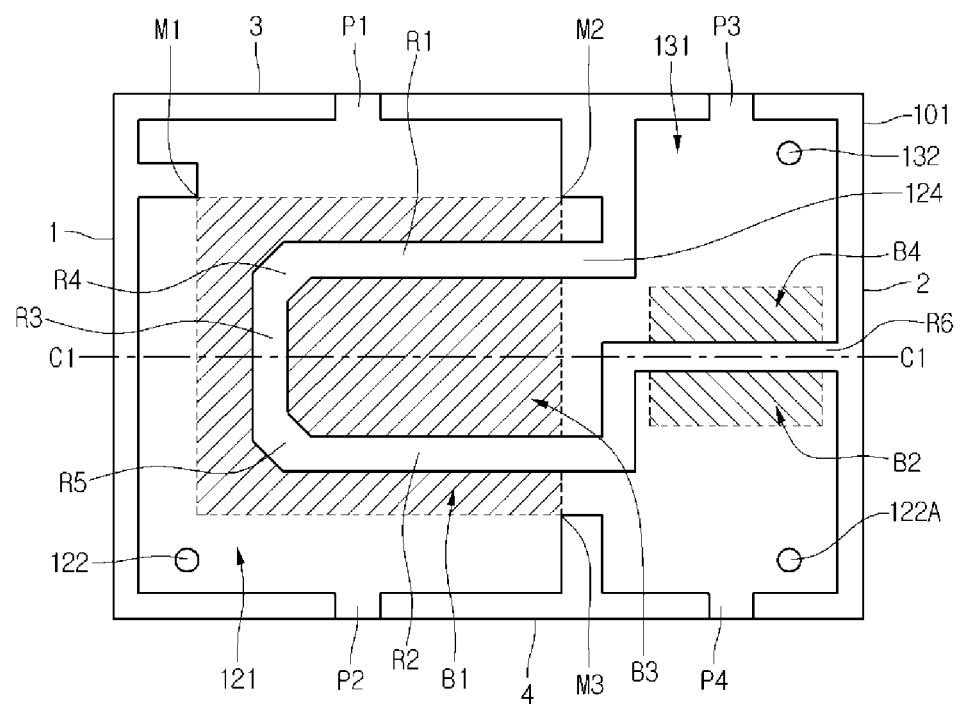
FIG. 4 a plan view showing a body according to the first embodiment.
Figure 5:
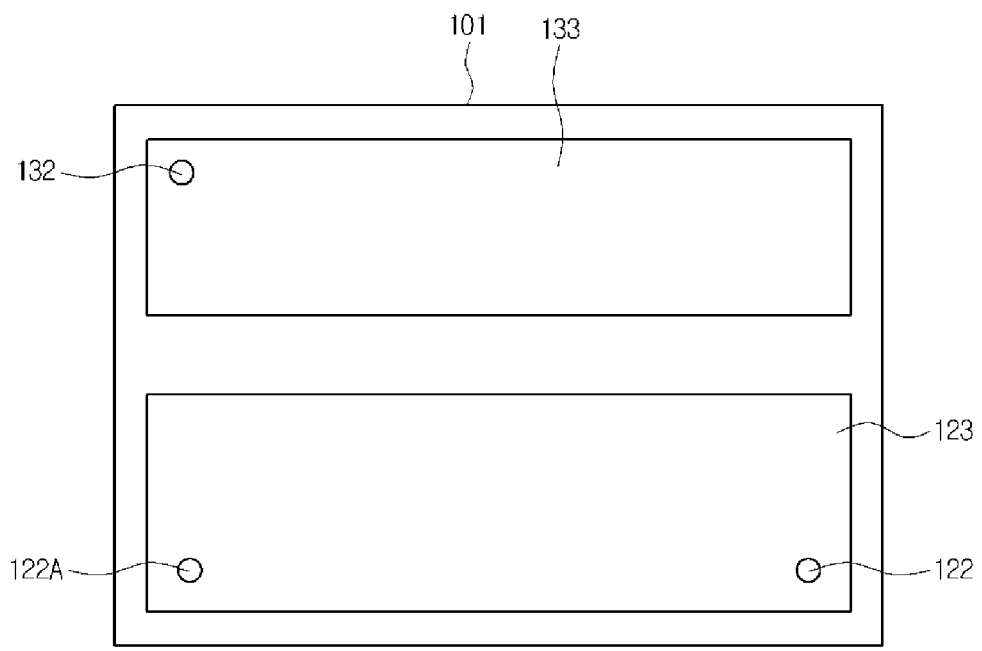
FIG. 5 is a bottom view of a light emitting device show in FIG. 1.
Figure 6:
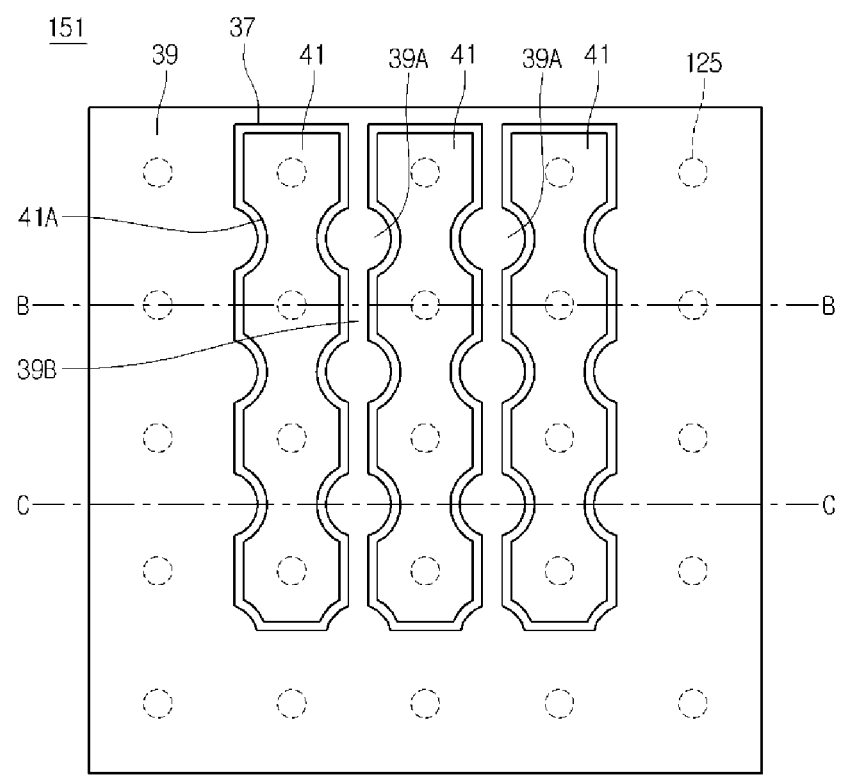
FIG. 6 is a plan view showing a light emitting chip of FIG. 3.
Figure 7:
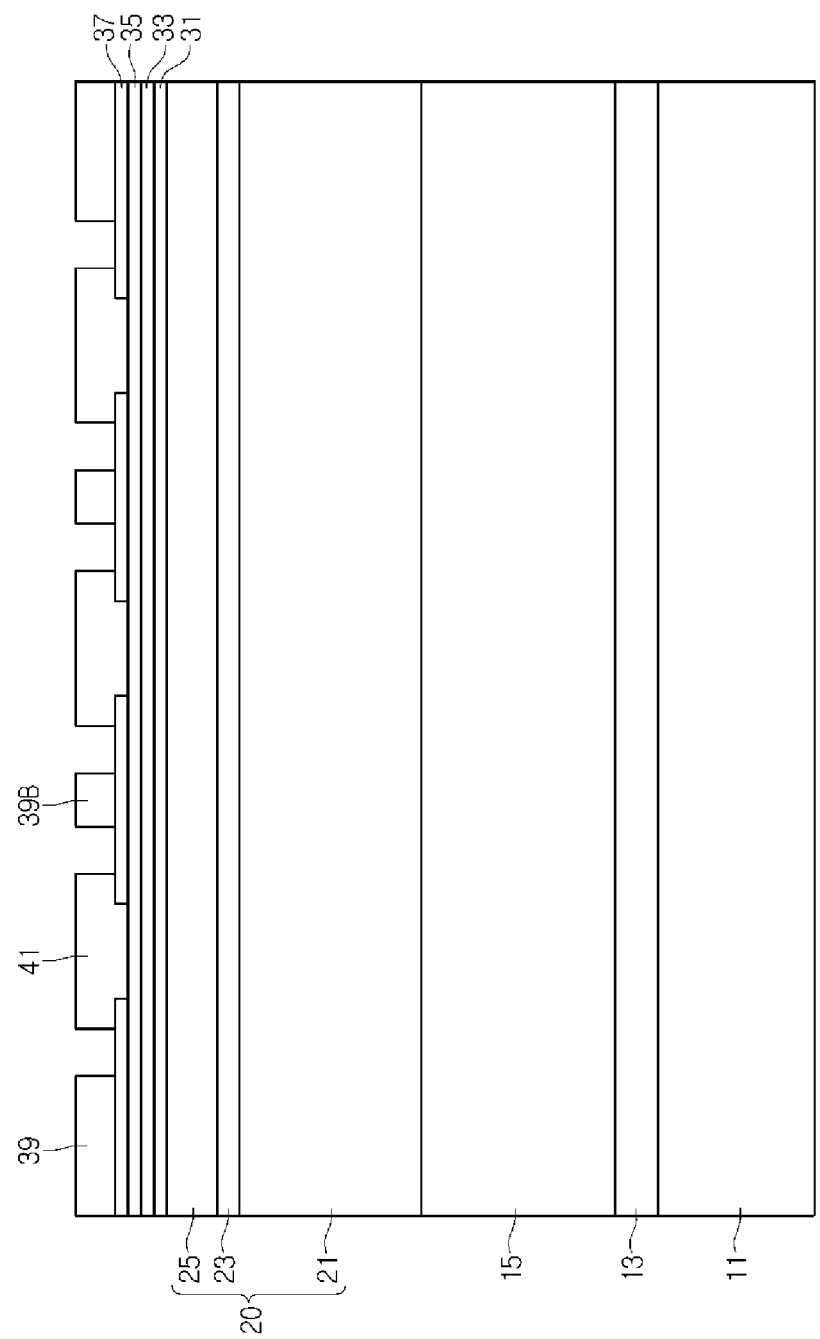
FIG. 7 is a sectional view taken along line B-B of a light emitting chip shown in FIG. 6.
Figure 8:
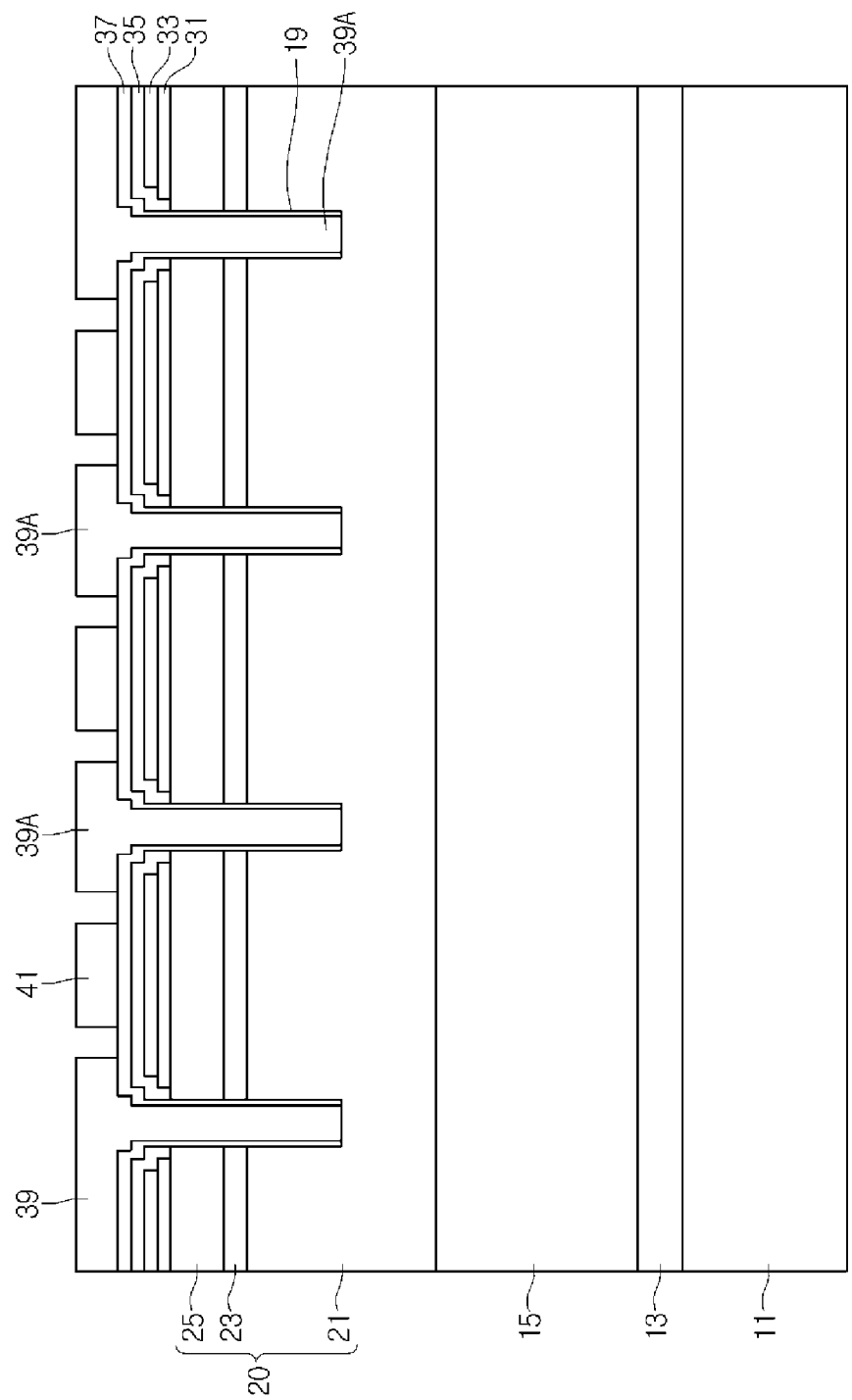
FIG. 8 is a sectional view taken along line C-C of a light emitting chip shown in FIG. 6.

FIG. 1 is a perspective view showing a light emitting device according to the first embodiment, FIG. 2 is a side sectional view taken along line A-A of a light emitting device shown in FIG. 1, FIG. 3 is a plan view showing a light emitting chip and a protective chip mounted on a body shown in FIG. 1, FIG. 4 a plan view showing a body according to the first embodiment, FIG. 5 is a bottom view of a light emitting device show in FIG. 1, FIG. 6 is a plan view showing a light emitting chip of FIG. 3, FIG. 7 is a sectional view taken along line B-B of a light emitting chip shown in FIG. 6, and FIG. 8 is a sectional view taken along line C-C of a light emitting chip shown in FIG. 6.

Referring to FIGS. 1 to 4, the light emitting device 100 includes a body 101; first and second lead electrodes 121 and 131 disposed on a top surface of the body 101; third and fourth electrodes 123 and 133 disposed on the bottom surface of the body 101; at least one first connection electrode 122 and 122A connecting the first and third lead electrodes 121 and 123 to each other through the body 101; a second connection electrode 132 connecting the second and fourth lead electrodes 131 and 133 to each other through the body 101; a light emitting chip 151 disposed on the first and second lead electrodes 121 and 131; a protective chip 171 formed on the first and second lead electrodes 121 and 131; a first resin layer 155 disposed around the light emitting chip 151 and the protective chip 151; a second resin layer disposed on the first resin layer 155; and a phosphor layer 153 between the light emitting chip 151 and the second resin layer.

The body 101 includes an insulating material, for example, a ceramic material. The ceramic material may include LTCC (low temperature co-fired ceramic) or HTCC (high temperature co-fired ceramic). The body 101 may include metal oxide, such as $SiO_2$, $Si_xO_y$, $Si_3N_4$, $Si_xN_y$, $SiO_xN_y$, $Al_2O_3$, or AlN. Preferably, the body 101 may include AlN or $Al_2O_3$, or metal oxide having thermal conductivity of 140 W/mK.

The body 101 may be disposed by using a resin-based insulating material, such as PPA (polyphthalamide). The body 101 may be disposed by using silicon, epoxy resin, thermosetting resin including a plastic material, a high heat-resistance material or a high light-resistance material. The silicon includes white resin. In addition, an acid anhydride, an antioxidant, a release agent, a light reflective material, inorganic filler, a hardening catalyst, a light stabilizer, a lubricant, or titanium dioxide may be selectively added to the body 101.

The body 101 may be disposed by using at least one selected from the group consisting of epoxy resin, modified epoxy resin, silicon resin, modified silicon resin, acryl resin and urethane resin. For instance, the body 101 can be disposed by using B-stage solid epoxy resin composition, which can be obtained by mixing the epoxy resin, such as triglycidylisocyanurate or hydride bisphenol A diglycidylether, with the acid anhydride promoter, such as hexahydro phthalic anhydride, 3-methyl hexahydro phthalic anhydride or 4-methyl hexahydro phthalic anhydride, and then partially hardening the mixture after adding DBU (1.8-Diazabicyclo(5,4,0)undecene-7) serving as a hardening accelerator and ethylene glycol, titanium oxide pigment or glass fiber serving as a promoter to the epoxy resin, but the embodiment is not limited thereto.

As shown in FIGS. 1 and 3, the body 101 includes first and second sides 1 and 2, which are opposite to each other, and third and fourth sides 3 and 4, which are adjacent to the first and second sides 1 and 2 and opposite to each other. The length D1 of the first and second sides 1 and 2 may be longer than the length D2 of the third and fourth sides 3 and 4. For instance, the length D1 may be in the range of 1.6 mm±0.5 mm, and the length D2 may be in the range of 2.2 mm±0.5 mm, which is at least twice longer than a width A2 of the light emitting chip 151. As shown in FIG. 3, a line C1 extending through the center of the first and second sides 1 and 2 may be aligned with the center of the light emitting chip 151 and the protective chip 171. The lengths D1 and D2 may vary depending on the alignment direction of the light emitting chip 151 and the protective chip 171, and the embodiment does not limit the lengths D1 and D2.

The light emitting chip 151 is disposed adjacent to the first side 1 of the body 101 and the protective chip 171 is disposed adjacent to the second side 2 of the body 101. A distance D3 between a center line C2 of the light emitting chip 151 and the first side 1 of the body 101 is in the range of 0.7 mm±0.1 mm, and a distance D4 between a center line C3 of the protective chip 171 and the second side 2 of the body 101 is in the range of 0.36 mm±0.05 mm. The distance D3 may be longer than the distance D4. In detail, the distance D3 is about twice longer than the distance D4 to allow the light emitting chip 151 to be disposed closer to the center position of the body 101 and to protect the light emitting chip 151.

The width A1 of the light emitting chip 151 in the first direction may be the same as the width A2 of the light emitting chip 151 in the second direction, but the embodiment is not limited thereto. The widths A1 and A2 are in the range of 1 mm±0.5 mm. The protective chip 171 may have a width corresponding to ½ of the widths A1 and A2 of the light emitting chip 151 in at least one of the first and second directions.

Referring to FIG. 2, a thickness T1 of the body 101 is in the range of 380 μm±5 μm to support the light emitting device.

As shown in FIGS. 3 and 5, first to fourth lead electrodes 121, 131, 123 and 133 are disposed in the body 101. The first and second lead electrodes 121 and 131 are disposed on the top surface of the body 101 and the third and fourth lead electrodes 123 and 133 are disposed on the bottom surface of the body 101.

The first lead electrode 121 includes first and second bonding parts B1 and B2 and the first bonding part B1 is disposed with an open receiving region therein. The second bonding part B2 extends from the first bonding part B1. The second lead electrode 131 includes third and fourth bonding parts B3 and B4, in which the third bonding part B3 has a protrusion structure and is corresponded to the receiving region of the first bonding part B1 of the first lead electrode 121. A gap part 124 is disposed between the first and third bonding parts B1 and B3. At least three sides, for instance, three to seven sides of the first and third bonding parts B1 and B3 may correspond to each other in the gap part 124. That is, the first bonding part B1 is disposed around the third bonding part B3 to spread the current through an electrode of the light emitting chip 151. The fourth bonding part B4 extends from the third bonding part B3 and is disposed corresponding to the second bonding part B2 of the first lead electrode 121.

In addition, the third bonding part B3 having a width wider than a width of the first bonding part B1 is disposed in the first bonding part B1, so that the bonding area with respect to the electrode can be increased at the center of the light emitting chip 151. Thus, the current can be effectively spread in the light emitting chip 151.

The first lead electrode 121 has a plurality of recess parts M1, M2 and M3 around the first bonding part B1. The recess parts M1, M2 and M3 are disposed corresponding to at least three edges of the light emitting chip 151. The recess parts M1, M2 and M3 are align marks for mounting the light emitting chip 151 and disposed inward than the outer peripheral surface of the first lead electrode 121. The recess parts M1, M2 and M3 are disposed in a region where the first lead electrode 121 is partially removed.

Among the recess parts M1, M2 and M3, a distance between the first and second recess parts M1 and M2 is the same as the width A2 of the light emitting chip 151 in the second direction. That is, the first and second recess parts M1 and M2 are spaced apart from each other corresponding to the length of one side of the light emitting chip 151. In addition, a distance between the second and third recess parts M2 and M3 is the same as the width A1 of the light emitting chip 151 in the first direction. That is, the second and third recess parts M2 and M3 are spaced apart from each other corresponding to the length of another one side of the light emitting chip 151. Further, the first and third recess parts M1 and M3 are spaced apart from each other corresponding to the diagonal length of the light emitting chip 151.

The connection electrode 122 having the via structure is disposed at a region adjacent to an edge of the light emitting chip 151 where the recess parts M1, M2 and M3 are not disposed. That is, the connection electrode 122 is spaced apart from the first and third recess parts M1 and M3. For instance, the connection electrode 122 is spaced apart from the first and third recess parts M1 and M3 by the width A2 of the light emitting chip 151, that is, by a distance longer than the length of one side of the light emitting chip 151.

Depths E1, E2 and E3 of the first to third recess parts M1, M2 and M3 may correspond to the distances between the light emitting chip 151 and sides 1, 3 and 4 of the body 101. The depths E2 and E3 of the second and third recess parts M2 and M3 are equal to each other and different from the depth E1 of the first recess part M1.

The light emitting chip 151 is aligned on the first to third recess parts M1, M2 and M3 and then mounted on the first and third bonding parts B1 and B3 of the first and second lead electrodes 121 and 131.

First and second support protrusions P1 and P2 are disposed on the first lead electrode 121, in which the first support protrusion P1 is exposed to the third side 3 of the body 101 and the second support protrusion P2 is exposed to the fourth side 4 of the body 101.

Third and fourth support protrusions P3 and P4 are disposed on the second lead electrode 131, in which the third support protrusion P3 is exposed to the third side 3 of the body 101 and the fourth support protrusion P4 is exposed to the fourth side 4 of the body 101.

The first and second support protrusions P1 and P2 are disposed adjacent to the line C2 extending through the center of the light emitting chip and first and third bonding parts B1 and B3 are disposed on the line C1. The third and fourth support protrusions P3 and P4 can be disposed on the center aligned with the center of the line C3 extending through the center of the protective chip 171.

Outer surfaces of the first and second lead electrodes 121 and 131 are spaced apart from the sides 1, 2, 3 and 4 of the body 101 by predetermined distances G1 and G2 so that the first and second lead electrodes 121 and 131 can be prevented from being delaminated. The distances G1 and G2 have the size of 50 μm or above, for instance, in the range of 150 μm to 200 μm such that a lower portion 156 of the first resin layer can sufficiently make contact with the top surface of the body 101. In addition, exposure of the first and second lead electrodes 121 and 131 to the outside is diminished to improve the electric reliability.

The first and third bonding parts B1 and B3 are disposed between the first and second support protrusions P1 and P2 and a segment of a line connecting the first and second support protrusions P1 and P2 to each other may extend through the center of the light emitting chip 151. The first and second support protrusions P1 and P2 are disposed in opposition to each other about the first and third bonding parts B1 and B3 to support the region of the first and third bonding parts B1 and B3.

The second and fourth bonding parts B2 and B4 are disposed between the third and fourth support protrusions P3 and P4 and a segment of a line connecting the third and fourth support protrusions P3 and P4 to each other may extend through the center of the protective chip 171. The third and fourth support protrusions P3 and P4 are disposed in opposition to each other about the second and fourth bonding parts B2 and B4 to support the region of the second and fourth bonding parts B2 and B4. A virtual line connecting the first and second support protrusions P1 and P2 to each other may be aligned with the center of the light emitting chip 151 and a virtual line connecting the third and fourth support protrusions P3 and P4 to each other may be aligned with the center of the protective chip 171.

In addition, as shown in FIG. 2, the first to fourth support protrusions P1 to P4 make contact with the lower portion 156 of the second resin layer 155 so that the first to fourth support protrusions P1 to P4 can be prevented from being delaminated from the top surface of the body 101.

As shown in FIG. 4, the gap part 124 is disposed between the first and second lead electrodes 121 and 131. The gap part 124 may include first gap parts R1 to R5 disposed between the first and third bonding parts B1 and B3, and a second gap part R6 disposed between the second and fourth bonding parts M2 and M4.

The first gap parts R1 to R5 may include first and second regions R1 and R2, which are spaced apart from each other by a width D8 of the third bonding part B3 in parallel to each other, and a third region R3 connected to the first and second regions R1 and R2 perpendicularly to the first and second regions R1 and R2. In addition, the first gap parts R1 to R5 may include fourth and fifth regions R4 and R5 which are bent between the third region R3 and the first and second regions R1 and R2. The fourth and fifth regions R4 and R5 may be curved or bent at an obtuse angle between the third region R3 and the first and second regions R1 and R2. In addition, at least one of the fourth and fifth regions R4 and R5 may be omitted and the embodiment is not limited thereto.

The second gap part R6 includes a sixth region R6 which is parallel to the first and second regions R1 and R2 and vertical to the third region R3. The sixth region R6 is spaced apart from the second region R2 by a predetermined distance and connected to the second region R2. The center of the sixth region R6 is aligned with the center between the first and second regions R1 and R2.

Referring to FIG. 5, the third and fourth lead electrodes 123 and 133 are disposed on a bottom surface 102 of the body 101. The third lead electrode 123 is connected to the first lead electrode 121 through the first connection electrodes 122 and 122A and the fourth lead electrode 133 is connected to the second lead electrode 131 through the second connection electrode 132. At least one of the first connection electrodes 122 and 122A is disposed in the body 101 and connected to the first and third lead electrodes 121 and 123. At least one second connection electrode 132 is disposed in the body 101 and connected to the second and fourth electrodes 131 and 133.

An area of the bottom surface of the third lead electrode 123 is different from an area of the bottom surface of the fourth lead electrode 133. For instance, the area of the bottom surface of the third lead electrode 123 is larger than the area of the bottom surface of the fourth lead electrode 133.

The first to fourth lead electrodes 121, 131, 123 and 133 may include a plurality of metals selected from the group consisting of Ti, Cu, Ni, Au, Cr, Ta, Pt, Pd, Sn, Ag, and P and may be prepared as a multi-layer structure. For instance, the first to fourth lead electrodes 121, 131, 123 and 133 may have a stack structure of Cu/Ni/Pd/Au. Since an Au-coating layer is disposed on the surface of the first to fourth lead electrodes 121, 131, 123 and 133, corrosion caused by penetration of moisture can be suppressed and the electric reliability can be improved.

The first to fourth lead electrodes 121, 131, 123 and 133 may have a thickness in the range of 80±2 µm. In this case, Cu has a thickness in the range of 7.5±1.5 µm, Ni has a thickness in the range of 5±1.5 µm, and Pd or Au has as a thickness in the range of 0.1±0.3 µm. Since Cu has the thick thickness, the heat conductive efficiency can be improved.

The coating layer is disposed except for outer surfaces of the first to fourth support protrusions P1 to P4. Since the first to fourth support protrusions P1 to P4 are present in the cutting surface, the coating layer is removed from the outer surfaces of the first to fourth support protrusions P1 to P4. The coating layer is disposed on the surfaces of the third and fourth lead electrodes 123 and 133.

As shown in FIGS. 2 and 3, the light emitting chip 151 is disposed on the first and second lead electrodes 121 and 131 disposed on the center region of the body 101, and the protective chip 171 is disposed on the first and second lead electrodes 121 and 131 disposed on the side region of the body 101.

The light emitting chip 151 is a light source capable of selectively emitting lights having the wavelength bands ranging from the ultraviolet ray band to the visible ray band. The light emitting chip 151 may include a UV (ultraviolet) LED (light emitting diode) chip, a green LED chip, a blue LED chip, and a red LED chip. A phosphor may be coated on a light emission region of the light emitting chip 151, but the embodiment is not limited thereto.

The light emitting chip 151 is bonded to the first and second lead electrodes 121 and 131 by a plurality of first bonding members 125, and the protective chip 171 is bonded onto the first and second lead electrodes 121 and 131 by a plurality of second bonding members 127. The first and second bonding members 125 and 126 may be disposed by using conductive materials, such as solder materials.

The light emitting chip 151 may have a thickness of 100 µm or above and the protective chip 171 may have a thickness in the range of 90 µm to 105 µm. The protective chip 171 may be implemented in the form of a thyristor, a zener diode or TVS (transient voltage suppression) and the protective chip 171 protects the light emitting chip 151 from ESD (electrostatic discharge). The phosphor layer 153 has a thickness D7 in the range of 0.15 µm to 60 µm. The light emitting device has a thickness D5 in the range of 0.75 mm±0.05 mm. The above thicknesses are determined by taking the support for the light emitting chip 151 and the thermal conductive efficiency into consideration.

The first resin layer 155 is disposed around the light emitting chip 151 without covering the top surface of the light emitting chip 151. The first resin layer 155 is positioned higher than the periphery and the top surface of the protective chip 171 to cover the top surface of the protective chip 171. A part of the first resin layer 155 is disposed among the top surfaces of the first and second lead electrodes 121 and 131, the light emitting chip 151 and the protective chip 171.

Metal oxide is added to a resin material of the first resin layer 155. The resin material includes silicon or epoxy and the metal oxide has a refractive index higher than that of the resin material. For instance, the metal oxide may include $TiO_2$ or $SiO_2$. At least 5 wt % or more of the metal oxide is added to the first resin layer 155. For instance, 5 wt % to 15 wt % of the metal oxide is added to the first resin layer 155. The first resin layer 155 having the metal oxide may serve as a reflective member around the light emitting chip 151. The reflective member represents reflectivity of at least 50% or more, for instance, 78% with respect to the light emitted from the light emitting chip 151. If the metal oxide contained in the first resin layer 155 exceeds 15 wt %, viscosity of the first resin layer 155 may be remarkably lowered, so the moisture may penetrate into the first resin layer 155 and bonding strength of the first resin layer 155 with respect to other materials may be lowered. In addition, if the content of the metal oxide in the first resin layer 155 is lowered, the reflective efficiency may be lowered, causing degradation of the light extraction efficiency.

The phosphor layer 153 is disposed on the light emitting chip 151. The phosphor layer 153 absorbs a part of the light emitted from the light emitting chip 151 to convert the wavelength of the light. The phosphor layer 153 may be disposed by adding a phosphor to a transmissive resin material, such as silicon or epoxy. The phosphor may include at least one of a yellow phosphor, a green phosphor, a blue phosphor and a red phosphor. For instance, the phosphor may include at least one selected from the group consisting of a nitride based phosphor, an oxy-nitride based phosphor and a sialon based phosphor, which are mainly activated by lanthanoid based elements, such as Eu or Ce; an alkali earth halogen apatite phosphor, which is mainly activated by a lanthanoid based element, such as Eu, or a transient metallic element, such as Mn; an alkali earth metal boric acid halogen phosphor; an alkali earth metal aluminate phosphor; an alkali earth silicate; an alkali earth sulfide; an alkali earth thio-gallate; an alkali earth silicon nitride; a germinate; a rare-earth aluminate mainly activated by a lanthanoid based element, such as Ce; a rare-earth silicate; and an organic chelating agent mainly activated by a lanthanoid based element, such as Eu, but the embodiment is not limited thereto.

A second resin layer 161 is disposed on the first resin layer 155 and the phosphor layer 153. The second resin layer 161 is a clean molding material to which additives, such as a phosphor, a diffusing agent or a scattering agent, may not be added, that is, impurities having the refractive index higher than that of the resin material may not be added. The second resin layer 161 may serve as a light exit surface and a top surface of the second resin layer 161 may be concave or convex.

The second resin layer 161 may have a thickness thicker than that of the phosphor layer 153, but the embodiment is not limited thereto.

FIG. 6 is a plan view showing the light emitting chip of FIG. 2, FIG. 7 is a sectional view taken along line B-B of the light emitting chip shown in FIG. 6, and FIG. 8 is a sectional view taken along line C-C of the light emitting chip shown in FIG. 6.

Referring to FIG. 6, the light emitting chip 151 includes a plurality of second electrodes 41 provided inside the light emitting chip 151 without being exposed to the lateral side of the light emitting chip 151, and a first electrode 39 disposed around the second electrodes 41. The second electrodes 41 are disposed inside the first electrode 39 and mounted on the third bonding part B3 of the second lead electrode 123.

The second electrodes 41 may be regularly aligned. Each of the second electrodes 41 includes a plurality of concave parts 41A having the structure corresponding to convex parts of the first electrode 39. A part of the first electrode 39 may be disposed among the second electrodes 41. The first electrode 39 may have a connection structure through the regions among the second electrodes 41.

The first electrode 39 is disposed over the entire area of the light emitting chip 151 and includes bridge electrodes 39B disposed among the second electrodes 41 and contact parts 39A connected to the bridge electrodes 39B and disposed on the concave parts 41A of the second electrodes 41. The concave part 41A of the second electrode 41 may have a hemispherical shape, but the embodiment is not limited thereto.

The first electrode 39 is connected to the first lead electrode 121 and the second electrodes 41 are connected to the second lead electrode 131 by the first bonding member 125. The bridge electrode 39B may have a top surface lower than top surfaces of the first and second electrodes 39 and 41, but the embodiment is not limited thereto.

Referring to FIGS. 7 and 8, the light emitting chip 151 may include a substrate 11, a buffer layer 13, a low-conductive layer 15, a first conductive semiconductor layer 21, an active layer 23, a second conductive semiconductor layer 25, a first electrode layer 31, a reflective layer 33, an insulating layer 37, the first electrode 39 and the second electrodes 41.

The substrate 11 may include a transmissive substrate, an insulating substrate or a conductive substrate. For instance, the substrate 11 may include at least one of $Al_2O_3$, SiC, Si, GaAs, GaN, ZnO, Si, GaP, InP, Ge, $Ga_2O_3$ and $LiGaO_3$. A plurality of protrusions may be disposed on at least one of a top surface and a bottom surface of the substrate 11. The protrusions can be disposed in a shape of a stripe, a hemisphere or a dome by etching the substrate 11 or can be disposed as a separate light extracting structure, such as a roughness. The substrate 11 may have a thickness in the range of 30 μm to 300 μm. The substrate 11 can be removed from the light emitting chip 151. In this case, the phosphor layer directly makes contact with the first conductive semiconductor layer.

A plurality of compound semiconductor layers may be grown on the substrate 11. The compound semiconductor layers may be disposed through an E-beam evaporator, PVD (physical vapor deposition), CVD (chemical vapor deposition), PLD (plasma laser deposition), a dual-type thermal evaporator, sputtering, or MOCVD (metal organic chemical vapor deposition), but the embodiment is not limited thereto.

The buffer layer 13 may be disposed on the substrate 11. The buffer layer 13 may be prepared as at least one layer by using a group II-VI or a group III to V compound semiconductor. The buffer layer 13 may include a semiconductor layer disposed by using the group III-V compound semiconductor. For instance, the buffer layer 13 may include at least one of compound semiconductors having the compositional formula of $In_xAl_yGa_{1-x-y}N$ ($0 \leq x \leq 1$, $0 \leq y \leq 1$, $0 \leq x+y \leq 1$), such as GaN, InN, AlN, InGaN, AlGaN, InAlGaN, and AlInN. The buffer layer 13 may have the superlattice structure by alternately stacking heterogeneous semiconductor layers.

The buffer layer 13 may attenuate the lattice mismatch between the substrate 11 and the nitride semiconductor layer and may be defined as a defect control layer. The buffer layer 13 may have a lattice constant between a lattice constant of the substrate 11 and a lattice constant of the nitride semiconductor layer. The buffer layer 13 may be disposed by using oxide, such as ZnO, but the embodiment is not limited thereto. The buffer layer 13 may have a thickness in the range of 30 nm to 500 nm, but the embodiment is not limited thereto.

The low-conductive layer 15 is disposed on the buffer layer 13. The low-conductive layer 15 includes an undoped semiconductor layer having conductivity lower than that of the first conductive semiconductor layer 21. The low-conductive layer 15 can be disposed by using the group III-V compound semiconductor, for instance, a GaN-based semiconductor. The undoped semiconductor layer has a low conductive property even if a conductive dopant is not intentionally doped thereto. At least one or all of the buffer layer 13 and the low-conductive layer 15 may be omitted from the light emitting chip 151, and the embodiment is not limited thereto.

The first conductive semiconductor layer 21 is disposed on the low-conductive layer 15. The first conductive semiconductor layer 21 can be disposed by using the group III-V compound semiconductor doped with a first conductive dopant. For instance, the first conductive semiconductor layer 21 can be disposed by using a semiconductor material having the compositional formula of $In_xAl_yGa_{1-x-y}N$ ($0 \leq x \leq 1$, $0 \leq y \leq 1$, $0 \leq x+y \leq 1$). The first conductive semiconductor layer 21 may be an n type semiconductor layer. If the first conductive semiconductor layer 21 is the n type semiconductor layer, the first conductive dopant includes the n type dopant, such as Si, Ge, Sn, Se or Te.

At least one of the low-conductive layer 15 and the first conductive semiconductor layer 21 may have the superlattice structure, in which heterogeneous first and second semiconductor layers are alternately stacked. Each of the first and second layers may have a thickness of about several Å or above.

A first clad layer (not shown) may be disposed between the first conductive semiconductor layer 21 and the active layer 23. The first clad layer may include a GaN-based semiconductor and may confine the carriers. According to another embodiment, the first clad layer may have the superlattice structure of InGaN or InGaN/GaN, but the embodiment is not limited thereto. The first clad layer may include n type and/or p type dopant. For instance, the first clad layer may be prepared as a first conductive semiconductor layer or a low-conductive semiconductor layer.

The active layer 23 is disposed on the first conductive semiconductor layer 21 or the first clad layer. The active layer 23 may include at least one of a single quantum well structure, a multiple quantum well (MQW) structure, a quantum dot structure, and a quantum wire structure. The active layer 23 may have a stack structure of well/barrier layers. The well layer may have a continuous energy level. In addition, the well layer may be a quantum well layer having the quantum energy level. The well layer may be defined as a quantum well layer and the barrier layer may be defined as a quantum barrier layer. The well/barrier layers may repeat with the periodicity of 2 to 30. For instance, the well layer can be disposed by using a semiconductor material having the compositional formula of $In_xAl_yGa_{1-x-y}N$ ($0 \leq x \leq 1$, $0 \leq y \leq 1$, $0 \leq x+y \leq 1$). The barrier layer may be prepared as a semiconductor layer having a bandgap wider than that of the well layer. For instance, the barrier layer can be disposed by using a semiconductor material having the compositional formula of $In_xAl_yGa_{1-x-y}N$ ($0 \leq x \leq 1$, $0 \leq y \leq 1$, $0 \leq x+y \leq 1$). The stack structure of the well/barrier layers may include at least one of InGaN/GaN, AlGaN/GaN, InGaN/AlGaN, and InGaN/InGaN.

The well layer may have the thickness in the range of 1.5 nm to 5 nm, for instance, 2 nm to 4 nm. The barrier layer has the thickness in the range of 5 nm to 30 nm, for instance, 5 nm to 7 nm, which is thicker than that of the well layer. The n type dopant may be doped into the barrier layer, but the embodiment is not limited thereto. The active layer 23 may selectively emit the light having the wavelength bands ranging from the ultraviolet ray band to the visible ray band. For instance, the active layer 23 may emit the light having the peak wavelength in the range of 420 nm to 450 nm.

A second clad layer (not shown) may be disposed on the active layer 23. The bandgap of the second clad layer is wider than the bandgap of the barrier layer of the active layer 23. The second conductive clad layer may include the group III-V compound semiconductor, such as a GaN-based semiconductor. For instance, the second clad layer may have the superlattice structure of GaN, AlGaN or InAlGaN. The second clad layer may include the n type and/or p type dopants and may be prepared as a second conductive semiconductor layer or a low-conductive semiconductor layer.

The second conductive semiconductor layer 25 is disposed on the second clad layer (not shown) or the active layer 23. The second conductive semiconductor layer 25 may include a second conductive dopant. For instance, the second conductive semiconductor layer 25 may include at least one of compound semiconductors, such as GaN, InN, AlN, InGaN, AlGaN, InAlGaN, and AlInN. If the second conductive semiconductor layer 25 is a p type semiconductor layer, the second conductive dopant is a p type dopant, such as Mg, Zn, Ca, Sr or Ba.

The first conductive semiconductor layer 21, the active layer 23 and the second conductive semiconductor layer 25 may constitute a light emitting structure layer 20.

In the light emitting structure layer 20, the conductive types of the first and second conductive semiconductor layers 21 and 25 may be changed inversely to the above. In detail, the second conductive semiconductor layer 25 may be prepared as the n type semiconductor layer and the first conductive semiconductor layer 21 may be prepared as the p type semiconductor layer. In addition, an n type semiconductor layer, which is a third conductive semiconductor layer having polarity opposite to that of the second conductive semiconductor layer 25, can be disposed on the second conductive semiconductor layer 25. The light emitting structure layer 20 may have one of an n-p junction structure, a p-n junction structure, an n-p-n junction structure, and a p-n-p junction structure. In the case of the n-p and p-n junction structures, the active layer 23 is disposed between two layers. In the case of the n-p-n and p-n-p junction structures, at least one active layer 23 is disposed among three layers.

The first electrode layer 31, the reflective layer 33, the second electrode layer 35, the insulating layer 37 and the second electrodes 41 are disposed on the light emitting structure layer 20 and the first electrode 39 is disposed on a part of the light emitting structure layer 20.

The first electrode layer 31 is a current spreading layer and includes transmissive and electric conductive materials. The first electrode layer 31 may be prepared as a transparent electrode layer having a refractive index lower than that of the compound semiconductor layer.

The first electrode layer 31 is disposed on the top surface of the second conductive semiconductor layer 25 and includes at least one of metal oxide and metal nitride. The first electrode layer 31 may include one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), ZnO, IrOx, RuOx and NiO. The first electrode layer 31 may be prepared as at least one layer. For instance, the first electrode layer 31 can be shallowly disposed by using at least one selected from the group consisting of Al, Ag, Pd, Rh, Pt Ir and an alloy thereof in such a manner that the light can pass through the first electrode layer 31. For instance, the first electrode layer 31 may have a thickness of 50 Å or less, for example, 10 Å.

The reflective layer 33 is disposed on the first electrode layer 31. The reflective layer 33 may include Ag or Al. Preferably, Al is used for the reflective layer 33 because Al represents reflectivity higher than that of Ag.

An adhesive layer (not shown) may be partially disposed on a region between the first electrode layer 31 and the reflective layer 33. The adhesive layer may include a fluoric transient metal compound representing the transmittance of 80% or more with respect to the light having the wavelength of 450 nm. Since the adhesive layer represents higher adhesive force with respect to the Al reflective layer, rather than the Ag reflective layer, the adhesive property of the reflective layer 33 can be improved. Since the adhesive property of the reflective layer 33 is improved, the reflective efficiency can also be improved. The adhesive layer may have a thickness in the range of 10 nm to 1 μm by taking the adhesive strength with respect to the reflective layer 33 into consideration.

The second electrode layer 35 is disposed on the reflective layer 33. The second electrode layer 35 may be disposed by using a metal layer, such as a barrier metal layer. The second electrode layer 35 may include at least one of Ti, W, Ru, Rh, Ir, Mg, Zn, Al, In, Ta, Pd, Co, Ni, Si, Ge, Ag and Au and can be prepared as a single layer or a multi-layer. For instance, the second electrode layer 35 may be disposed by using an alloy, such as TiW (Titanium Tungsten), but the embodiment is not limited thereto. The first electrode layer 31, the reflective layer 33 and the second electrode layer 35 may have the stack structure of ITO/Ag/TiW. The first electrode layer 31 may be omitted.

As shown in FIG. 8, at least one recess 19 is disposed in the light emitting structure layer 20 and the at least one recess 19 may have a depth sufficient for exposing the light emitting structure layer 20 from the second conductive semiconductor layer 25 to a part of the first conductive semiconductor layer 21. A plurality of recesses 19 can be provided while being spaced apart from each other, but the embodiment is not limited thereto.

The insulating layer 37 is disposed on the second electrode layer 35 and extends around the recess 19. A hole is disposed in the insulating layer 37 disposed in the recess 19 and a part 39A of the first electrode 39 is disposed in the hole. The part 39A of the first electrode 39 has the via structure and physical makes contact with the first conductive semiconductor layer 21.

The insulating layer 37 may also be disposed at the sidewall between the first electrode 39 and the light emitting structure layer 20. The insulating layer 37 may include an insulating material or an insulating resin, such as oxide, nitride, fluoride or sulfide of Al, Cr, Si, Ti, Zn or Zr. For instance, the insulating layer 37 may include one elected from the group consisting of $SiO_2$, $Si_3N_4$, $Al_2O_3$, and $TiO_2$. The insulating layer 37 can be prepared as a single layer or a multi-layer, and the embodiment is not limited thereto.

In addition, the insulating layer 37 may include a non-conductive metal compound, such as a fluoride metal compound. For instance, the insulating layer 37 may be prepared as MxFy, in which M includes at least one of metals, such as Ga, Mg and Al, and a transient metal, x is in the range of 1 to 3, and y is 2 or 3. The fluoride transient metal compound includes $MgF_2$, $AlF_3$, or $GaF_3$.

The first electrode layer 31 is disposed on the light emitting structure layer 20, the reflective layer 33 is disposed on the first electrode layer 31, and the second electrode layer 35 is disposed on the reflective layer 33. The reflective layer 33 can cover about 80% or more of the top portion of the light emitting structure 20 and the adhesive strength of the reflective layer 33 can be improved by the adhesive layer. The second electrode layer 35 can make contact with the lateral sides of the first electrode layer 31 and the reflective layer 33, and the embodiment is not limited thereto.

The second electrodes 41 are disposed on the second electrode layer 35. The second electrodes 41 may branch in the form of an arm pattern and are connected with each other. A part of the insulating layer 37 may be further disposed between the second electrode 41 and the second electrode layer 35, but the embodiment is not limited thereto. The first electrode 39 may have an upper width wider than a lower width thereof and the second electrode 41 may have an upper width wider than a lower width thereof.

Since the top surfaces of the first and second electrodes 39 and 41 are aligned on the same plane on the light emitting structure layer 20, the first and second electrodes 39 and 41 can be mounted on the substrate or in the package in a flip scheme.

The first and second electrodes 39 and 41 may include Cr, Ti, Co, Ni, V, Hf, Ag, Al, Ru, Rh, Pt, Pd, Ni, Mo, W, La, Ta, Ti or an alloy thereof and can be prepared as a single layer or a multi-layer. In addition, the first and second electrodes 39 and 41 may have the same metal stack structure. For instance, the first and second electrodes 39 and 41 may have the stack structure of Cr/NiAl/Au, but the embodiment is not limited thereto.

In the light emitting chip 151, a part of the light emitted from the active layer 23 is reflected from the reflective layer 33 and extracted toward the substrate 11 and the sidewall. The light emitting chip 151 can be bonded onto the substrate or in the package in a flip scheme.

Figure 9:
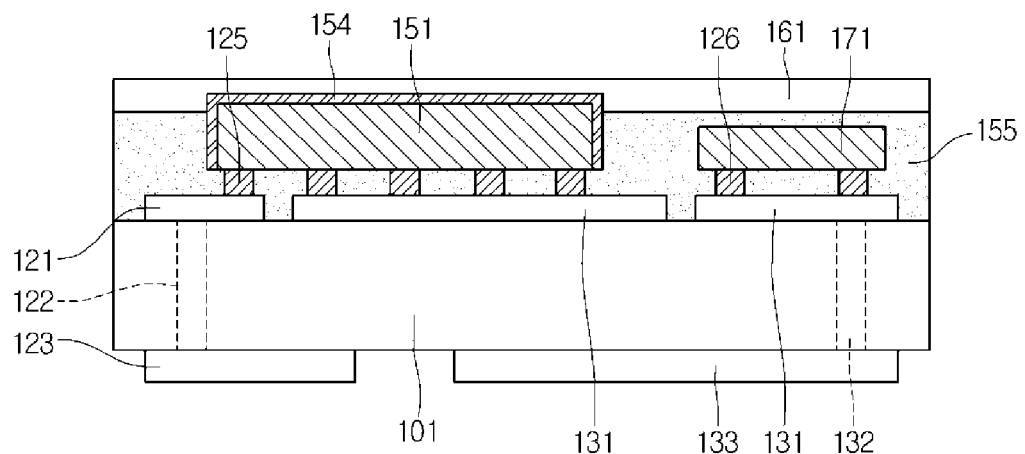
FIG. 9 is a side sectional view showing a light emitting device according to the second embodiment.

FIG. 9 is a side sectional view showing a light emitting device according to the second embodiment. In the following description of the second embodiment, the description about the first embodiment will be incorporated by reference.

Referring to FIG. 9, the light emitting device includes a body 101, a plurality of lead electrodes 121, 131, 123 and 133, a plurality of connection electrodes 122 and 132, a light emitting chip 151, a protective chip 171, a first resin layer 155, a second resin layer 151 and a phosphor layer 154.

The phosphor layer 154 extends from the top surface to the lateral side of the light emitting chip 151. Since the phosphor layer 154 is disposed on the top surface and the lateral side of the light emitting chip 151, a part of the light emitted from the active layer of the light emitting chip 151 is converted to have a long wavelength by a phosphor of the phosphor layer 154. The phosphor layer 154 disposed on the lateral side of the light emitting chip 151 makes contact with the first resin layer 155 so that the adhesive property of the phosphor layer 154 can be improved and the light loss caused by the light reflection at the first resin layer 155 can be prevented.

The second resin layer 155 is disposed around the light emitting chip 151 and makes contact with all lateral sides of the light emitting chip 151. The first resin layer 155 can be disposed by adding first metal oxide to a silicon material. The first metal oxide includes a material having a high refractive index, such as $TiO_2$ having a refractive index of 2.0 or more. The content of the first metal oxide added to the first resin layer 155 is in the range of 5 wt % to 15 wt %, for instance, 10 wt % to 15 wt %. The silicon material of the first resin layer 155 has the refractive index in the range of 1.51 to 1.55. Such a silicon material has the superior adhesive property with respect to other materials.

The first resin layer 155 including the first metal oxide may serve as a reflective layer capable of reflecting about 70% or more of the light emitted from the light emitting chip 151. Since the first resin layer 155 serves as the reflective layer, the light emitted in the lateral direction of the light emitting chip 151 can be effectively reflected. A first molding member 155 is bonded to the lateral side of the light emitting chip 151 so the beam distribution of the light emitted from the light emitting chip 151 can be improved.

The second resin layer 161 may be disposed by using a material having superior adhesive property with respect to the first resin layer 155. For instance, the second resin layer 161 may include a material the same as a material of the first resin layer 155.

The second resin layer 161 makes contact with the top surfaces of the first resin layer 155 and the light emitting chip 151. The second resin layer 161 can be disposed by adding second metal oxide to a silicon material. The second metal oxide includes a material having a high refractive index and is different from the first metal oxide added to the first resin layer 155. For instance, the second metal oxide may include $SiO_2$ having a refractive index of 2 or less. The second resin layer 161, which is disposed by adding the second metal oxide to the silicon material, may serve as a diffusion layer. If the first and second resin layers 155 and 161 are disposed by using the same material, a bubble and an interfacial de-adhesion can be prevented at the interfacial surface between the first and second resin layers 155 and 161.

Figure 10:
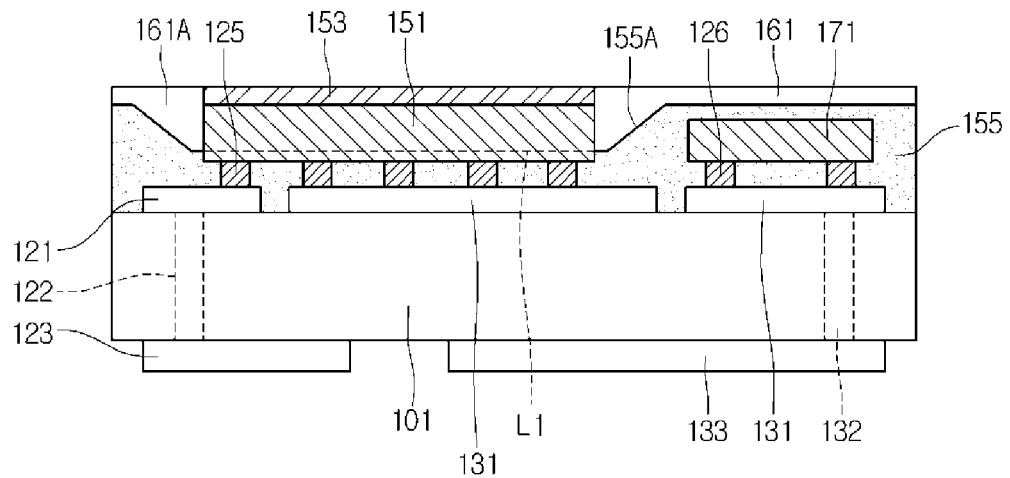
FIG. 10 is a side sectional view showing a light emitting device according to the third embodiment.

FIG. 10 is a side sectional view showing a light emitting device according to the third embodiment. In the following description of the third embodiment, the description about the first embodiment will be incorporated by reference.

Referring to FIG. 10, the light emitting device includes a body 101, a plurality of lead electrodes 121, 131, 123 and 133, a plurality of connection electrodes 122 and 132, a light emitting chip 151, a protective chip 171, a first resin layer 155, a second resin layer 161 and a phosphor layer 153.

The first resin layer 155 has a recess 155A having a bottom surface higher than a bottom surface of the light emitting chip 51. For instance, the bottom surface of the recess 155A may have the height similar to or equal to a top surface line L1 of a reflective layer in the light emitting chip 151. In addition, an inner wall of the recess 155A is inclined with respect to the lateral side of the light emitting chip 151 or the bottom surface of the recess 155A to reflect the incident light toward the light exit surface.

A part 161A of the second resin layer 161, which is in contact with an outer peripheral portion of the light emitting chip 151, makes contact with the recess 155A. Thus, the part 161A of the second resin layer 161 may guide the light emitted from the light emitting chip 151 in the lateral direction.

In addition, the phosphor layer 153 is disposed on the light emitting chip 151 and the top surface of the phosphor layer 153 may be aligned on the same plane with the top surface of the second resin layer 161. The phosphor layer 153 may extend to the lateral side of the light emitting chip 151, and the embodiment is not limited thereto. Since the light emitting chip 151 is mounted in a flip scheme, most of the light emitted from the light emitting chip 151 is directed upward and about 20% or less of the light is directed in the lateral direction. Thus, even if the phosphor layer 153 is disposed at the lateral side of the light emitting chip 151, the wavelength conversion rate of the light at the lateral side of the light emitting chip 151 may be low.

Figure 11:
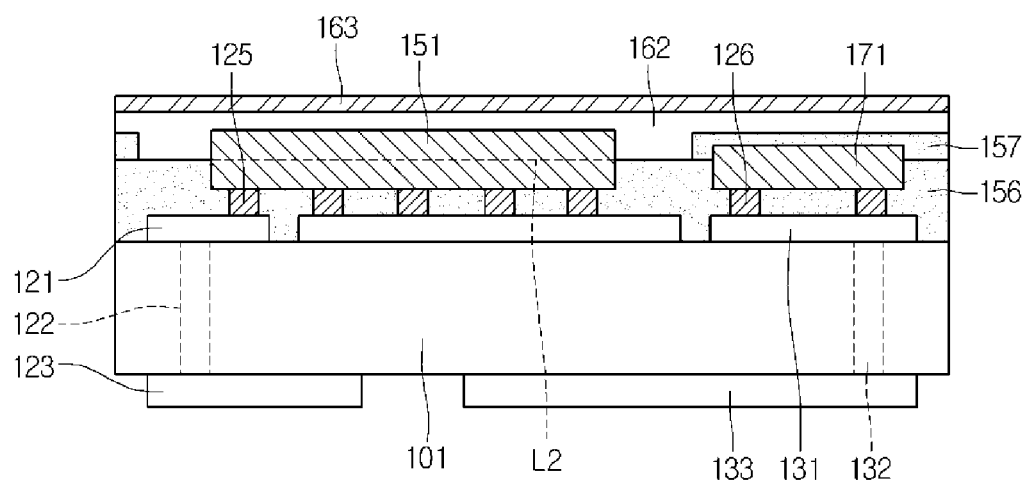
FIG. 11 is a side sectional view showing a light emitting device according to the fourth embodiment.

FIG. 11 is a side sectional view showing a light emitting device according to the fourth embodiment. In the following description of the fourth embodiment, the description about the first embodiment will be incorporated by reference.

Referring to FIG. 11, the light emitting device includes a body 101, a plurality of lead electrodes 121, 131, 123 and 133, a plurality of connection electrodes 122 and 132, a light emitting chip 151, a protective chip 171, a first resin layer 156, a second resin layer 162, a third resin layer 157 and a phosphor layer 163.

The top surface of the first resin layer 156 is aligned corresponding to the line L2 disposed between the bottom surface of the active layer of the light emitting chip 151 and the bottom surface of the second conductive semiconductor layer. The top surface of the first resin layer 156 may be lower than the top surface of the protective chip 171 and the light absorbing loss may occur when the protective chip 171 is exposed. To solve this problem, the third resin layer 157 is disposed on the protective chip 171.

The third resin layer 157 is disposed on the protective chip 171 and the first resin layer 156 and the metal oxide added to the first resin layer 156 is added to the third resin layer 157 so that the third resin layer 157 may serve as a reflective member. About 5 wt % or more of the metal oxide may be added to the third resin layer 157. For instance, the content of the metal oxide added to the third resin layer 157 may be higher than the content of the metal oxide added to the first resin layer 156 in a predetermined ratio (for instance, 5 wt % or more).

The third resin layer 157 is spaced apart from the lateral side of the light emitting chip 151, so the third resin layer 157 may serve as a reflective sidewall.

The second resin layer 162 is disposed on the light emitting chip 151, the first resin layer 156 and the third resin layer 157. A part of the second resin layer 162 is disposed between the light emitting chip 151 and the third resin layer 157 to induce the light extraction in the lateral direction.

The phosphor layer 163 is disposed on the second resin layer 162 and on the entire top surface of the light emitting device. The phosphor layer 163 can be prepared in the form of a film or a resin layer, but the embodiment is not limited thereto.

<Lighting System>

The light emitting device according to the embodiment is applicable to a lighting system. The lighting system includes a structure in which a plurality of light emitting devices are arrayed. The lighting system includes a display apparatus shown in FIGS. 12 and 13, a lighting apparatus shown in FIG. 14, a lighting lamp, a camera flash, a signal lamp, a headlamp for a vehicle, and an electronic display.

Figure 12:
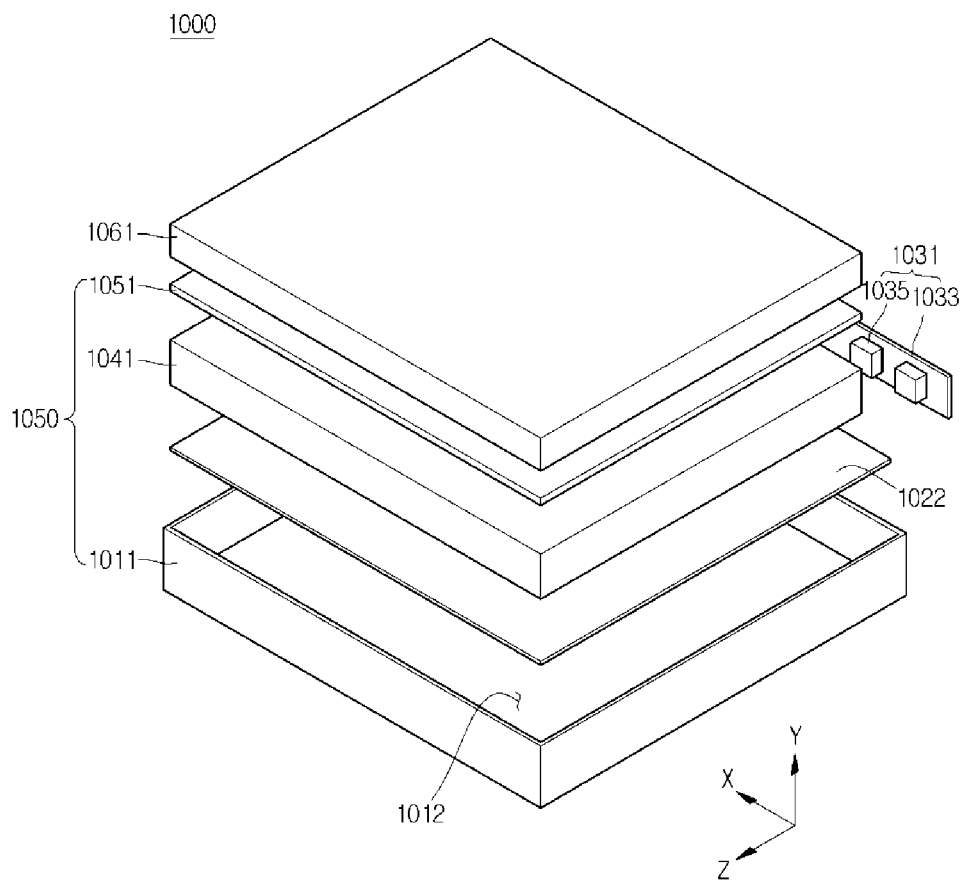
FIG. 12 is a perspective view illustrating a display apparatus including a light emitting device according to the embodiment.

FIG. 12 is an exploded perspective view showing a display apparatus having the light emitting device according to the embodiment.

Referring to FIG. 12, a display apparatus 1000 according to the embodiment includes a light guide plate 1041, a light source module 1031 to supply light to the light guide plate 1041, a reflective member 1022 under the light guide plate 1041, an optical sheet 1051 on the light guide plate 1041, a display panel 1061 on the optical sheet 1051, and a bottom cover 1011 to receive the light guide plate 1041, the light source module 1031, and the reflective member 1022, but the embodiment is not limited thereto.

The bottom cover 1011, the reflective sheet 1022, the light guide plate 1041, the optical sheet 1051, and the light unit 1050 may be defined as a light unit 1050.

The light guide plate 1041 diffuses the light supplied from the light source module 1031 to provide surface light. The light guide plate 1041 may include a transparent material. For example, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphtha late) resin.

The light source module 1031 is disposed on at least one side of the light guide plate 1041 to supply the light to at least one side of the light guide plate 1041. The light source module 1031 serves as the light source of the display device.

At least one light source module 1031 is disposed to directly or indirectly supply the light from one side of the light guide plate 1041. The light source module 1031 may include a substrate 1033 and the light emitting device according to the embodiments or the light emitting device 1035. The light emitting device or the light emitting device 1035 are arranged on the substrate 1033 while being spaced apart from each other at the predetermined interval.

The substrate 1033 may include a printed circuit board (PCB) including a circuit pattern (not shown). In addition, the substrate 1033 may also include a metal core PCB (MCPCB) or a flexible PCB (FPCB) as well as a typical PCB, but the embodiment is not limited thereto. If the light emitting device 1035 is installed on the side of the bottom cover 1011 or on a heat dissipation plate, the substrate 1033 may be omitted. The heat dissipation plate partially makes contact with the top surface of the bottom cover 1011.

In addition, the light emitting device 1035 are arranged such that light exit surfaces to discharge light of the light emitting device 1035 are spaced apart from the light guide plate 1041 by a predetermined distance on the substrate 1033, but the embodiment is not limited thereto. The light emitting device 1035 may directly or indirectly supply the light to a light incident surface, which is one side of the light guide plate 1041, but the embodiment is not limited thereto.

The reflective member 1022 is disposed under the light guide plate 1041. The reflective member 1022 reflects the light, which is traveled downward through the bottom surface of the light guide plate 1041, toward the display panel 1061, thereby improving the brightness of the light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light source module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by allowing the light to pass therethrough. The display device 1000 can be applied to various portable terminals, monitors of notebook computers, monitors or laptop computers, and televisions.

The optical sheet 1051 is disposed between the display panel 1061 and the light guide plate 1041 and includes at least one transmissive sheet. For example, the optical sheet 1051 includes at least one selected from the group consisting of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be disposed on the display panel 1061, but the embodiment is not limited thereto.

The light guide plate 1041 and the optical sheet 1051 can be disposed in the light path of the light source module 1031 as optical members, but the embodiment is not limited thereto.

Figure 13:
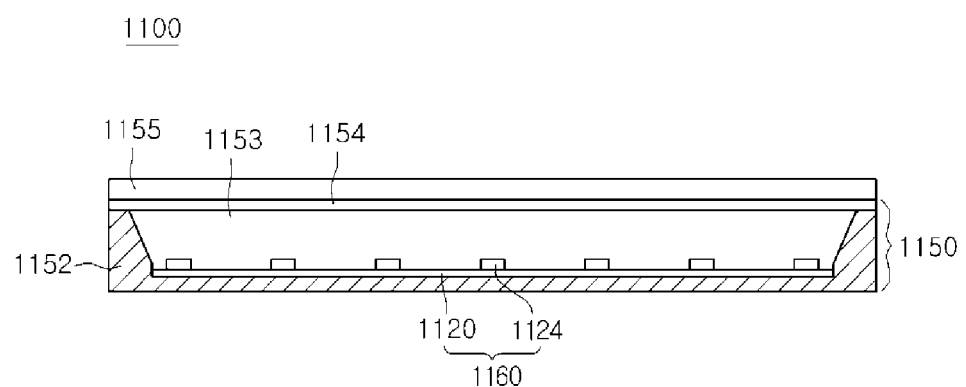
FIG. 13 is a perspective view illustrating a display apparatus including a light emitting device according to the embodiment.

FIG. 13 is a sectional view showing a display apparatus according to the embodiment.

Referring to FIG. 13, the display apparatus 1100 includes a bottom cover 1152, a substrate 1120 on which the light emitting device 1124 are arrayed, an optical member 1154, and a display panel 1155.

The substrate 1120 and the light emitting device 1124 may constitute the light source module 1160. In addition, the bottom cover 1152, at least one light source module 1160, and the optical member 1154 may constitute the light unit. The bottom cover 1151 can be disposed with a receiving section 1153, but the embodiment is not limited thereto. The light source module 1160 includes a substrate 1120, and a plurality of light emitting devices arranged on the substrate 1120 or a light emitting device 1124.

The optical member 1154 may include at least one selected from the group consisting of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto a display region, and the brightness enhanced sheet improves the brightness by reusing the lost light.

The optical member 1154 is disposed above the light source module 1160 in order to convert the light emitted from the light source module 1160 into the surface light.

Figure 14:
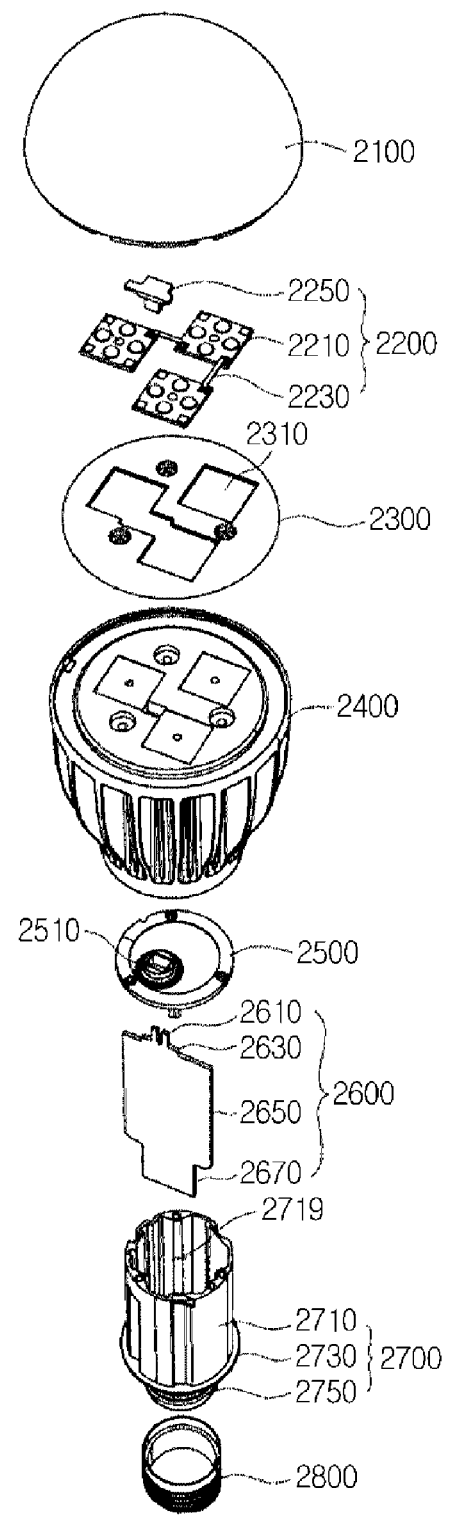
FIG. 14 is a perspective view illustrating a lighting system including a light emitting device according to the embodiment.

FIG. 14 is an exploded perspective view showing a lighting device having the light emitting device according to the embodiment.

Referring to FIG. 14, the lighting device according to the embodiment may include a cover 2100, a light source module 2200, a heat radiation member 2400, a power supply part 2600, an inner case 2700, and a socket 2800. In addition, the light emitting device according to the embodiment may further include at least one of a member 2300 and a holder 2500. The light source module 2200 may include the light emitting device according to the embodiment.

For example, the cover 2100 has the shape of a bulb, or a hemispherical shape. The cover 2100 may have a hollow structure, and a portion of the cover 2100 may be open. The cover 2100 may be optically connected to the light source module 2200, and may be coupled with the heat radiation member 2400. The cover 2100 may have a recess part coupled with the heat radiation member 2400.

The inner surface of the cover 2100 may be coated with ivory white pigments serving as a diffusing agent. The light emitted from the light source module 2200 may be scattered or diffused by using the ivory white material, so that the light can be discharged to the outside.

The cover 2100 may include glass, plastic, PP, PE, or PC. In this case, the PC represents superior light resistance, superior heat resistance, and superior strength. The cover 2100 may be transparent so that the light source module 2200 may be recognized at the outside. In addition, the cover 2100 may be opaque. The cover 2100 may be disposed through a blow molding scheme.

The light source module 2200 may be disposed at one surface of the heat radiation member 2400. Accordingly, the heat emitted from the light source module 2200 is conducted to the heat radiation member 2400. The light source module 2200 may include a light emitting device 2210, a connection plate 2230, and a connector 2250.

The member 2300 is disposed on the top surface of the heat radiation member 2400, and has a guide groove 2310 having a plurality of light emitting devices 2210 and a connector 2250 inserted into the guide groove 2310. The guide groove 2310 corresponds to the substrate of the light emitting device 2210 and the connector 2250.

White pigments may be applied to or coated on the surface of the member 2300. The member 2300 reflects light, which reflected by the inner surface of the cover 2100 to return to the light source module 2200, toward the cover 2100. Accordingly, the light efficiency of the lighting apparatus according to the embodiment can be improved.

The member 2300 may include an insulating material. The connection plate 2230 of the light source module 2200 may include an electric-conductive material. Accordingly, the heat radiation member 2400 may be electrically connected to the connection plate 2230. The member 2300 includes an insulating material to prevent the electrical short between the connection plate 2230 and the heat radiation member 2400. The heat radiation member 2400 receives heat from the light source module 2200 and the heat from the power supply part 2600 and radiates the heats.

The holder 2500 blocks a receiving groove 2719 of an insulating part 2710 disposed in an internal case 2700. Accordingly, the power supply part 2600 received in the insulating part 2710 of the internal case 2700 is sealed. The holder 2500 has a guide protrusion part 2510. The guide protrusion part 2510 may include a hole allowing a protrusion part 2610 of the power supply part 2600 to pass therethrough.

The power supply part 2600 processes and transforms an electrical signal received from the outside and supplies the electrical signal to the light source module 2200. The power supply part 2600 is received in the receiving groove 2719 of the internal case 2700, and sealed in the internal case 2700 by the holder 2500.

The power supply part 2600 may include a protrusion part 2610, a guide part 2630, a base 2650, and an extension part 2670.

The guide part 2630 protrudes outward from one side of the base 2650. The guide part 2630 may be inserted into the holder 2500. A plurality of parts may be disposed on one surface of the base 250. For example, the parts include a DC converter, a driving chip to drive the light source module 220, and an ESD (electrostatic discharge) protective device to protect the light source module 2200, but the embodiment is not limited thereto.

The extension part 2670 protrudes outward from another side of the base 2650. The extension part 2670 is inserted into the connection part 2750 of the internal case 2700, and receives an electrical signal from the outside. For example, the extension part 2670 may be equal to or less than the width of the connection part 2750 of the internal case 2700. The extension part 2670 may be electrically connected to the socket 2800 through a wire.

The internal case 2700 may be disposed therein with a molding part together with the power supply part 2600. The molding part is disposed by hardening a molding liquid, so that the power supply part 2600 may be fixed into the internal case 2700.

The embodiment has the following effects.

The light emitting device according to the embodiment can effectively dissipate heat of the light emitting chip.

The embodiment can provide the light emitting device having the align mark to readily mount the light emitting chip.

The light emitting device according to the embodiment can improve the light extraction efficiency.

The embodiment can improve the reliability of the light emitting device and the lighting system including the same.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a body;
a first lead electrode having a first bonding part on a top surface of the body and a second bonding part extending from the first bonding part;
a second lead electrode having a third bonding part inside the first bonding part and a fourth bonding part corresponding to the second bonding part;
a gap part between the first and second lead electrodes;
a third lead electrode on a bottom surface of the body;
a fourth lead electrode on the bottom surface of the body;
a first connection electrode to connect the first lead electrode to the third lead electrode in the body;
a second connection electrode to connect the second lead electrode to the third lead electrode in the body;
a light emitting chip on the first bonding part of the first lead electrode and the third bonding part of the second lead electrode; and
a first bonding member disposed among the light emitting chip, the first bonding part of the first lead electrode and the third bonding part of the second electrode,
wherein the gap part includes a first gap part disposed between the first and third bonding parts,
the first gap part includes first and second regions disposed in parallel to each other, and a third region connected to the first and second regions,
wherein the third bonding part is disposed between the first and second regions, and
wherein the first gap part is disposed between the light emitting chip and the body.

2. The light emitting device of claim 1, further comprising a protective chip on the second bonding part and the fourth bonding part.

3. The light emitting device of claim 2, wherein the gap part includes a second gap part disposed between the second and fourth bonding parts,
wherein the second gap part is disposed in parallel with respect to the first and second regions,
wherein the second gap part is disposed between the protective chip and the body.

4. The light emitting device of claim 3, further comprising a region which is bent at an obtuse angle with respect to the third region and disposed between at least one of the first and second regions and the third region.

5. The light emitting device of claim 1, wherein at least three sides of the first and third bonding parts correspond to each other in a region of the gap part, and
the light emitting chip includes a first electrode corresponding to the first bonding part, and a plurality of second electrodes corresponding to the third bonding part and disposed in mutually different regions.

6. The light emitting device of claim 1, further comprising:
a first resin layer including metal oxide around the light emitting chip;
a phosphor layer on the light emitting chip; and
a second resin layer on the first resin layer.

7. The light emitting device of claim 3, wherein outer surfaces of the first and second lead electrodes are spaced part from a lateral side of the body, and the light emitting device further comprises:
a first support protrusion extending from the first lead electrode to a first side of the body;
a second support protrusion extending from the first lead electrode to a second side of the body;
a third support protrusion extending from the second lead electrode to the first side of the body; and
a fourth support protrusion extending from the first lead electrode to the second side of the body.

8. The light emitting device of claim 7, wherein a virtual straight line connecting the first and second support protrusions to each other is aligned on a same line with a center of the light emitting chip.

9. The light emitting device of claim 8, wherein a virtual straight line connecting the third and fourth support protrusions to each other is aligned on a same line with a center of the protective chip.

10. The light emitting device of claim 2, wherein the third bonding part is disposed among the first, second and fourth bonding parts.

11. The light emitting device of claim 6, wherein a top surface of the light emitting chip is exposed from the first resin layer, and wherein the phosphor layer contacts the top surface of the light emitting chip and the second resin layer.

12. A light emitting device comprising:
a body;
a first lead electrode having a first bonding part on a top surface of the body and a second bonding part extending from the first bonding part;
a second lead electrode having a third bonding part inside the first bonding part and a fourth bonding part corresponding to the second bonding part;
a third lead electrode on a bottom surface of the body;
a fourth lead electrode on the bottom surface of the body;
a first connection electrode to connect the first lead electrode to the third lead electrode in the body;
a second connection electrode to connect the second lead electrode to the third lead electrode in the body;
a light emitting chip on the first bonding part of the first lead electrode and the third bonding part of the second lead electrode;
a first bonding member disposed among the light emitting chip, the first bonding part of the first lead electrode and the third bonding part of the second electrode; and
a protective chip disposed on the second bonding part of the first lead electrode and the fourth bonding part of the second lead electrode,
wherein the first lead electrode includes first to third recess parts disposed in regions corresponding to at least three corners of the light emitting chip, and
the first to third recess parts have depths corresponding to an interval between one side of the light emitting chip and one side of the body adjacent to the one side of the light emitting chip.

13. The light emitting device of claim 12, wherein the first and second recess parts are adjacent to one side of the light emitting chip, and an interval between the first and second recess parts corresponds to a length of the one side of the light emitting chip.

14. The light emitting device of claim 13, wherein the first and third recess parts are spaced apart from each other more than the interval between the first and second recess parts, and an interval between the first and third recess parts corresponds to a diagonal length of the light emitting chip.

15. The light emitting device of claim 13, wherein the first connection electrode is adjacent to one edge of the light emitting chip and spaced apart from the first to third recess parts by a distance longer than a length of one side of the light emitting chip.

16. The light emitting device of claim 12, further comprising:
a first resin layer including metal oxide around the light emitting chip;
a phosphor layer on the light emitting chip; and
a second resin layer on the first resin layer.

17. The light emitting device of claim 16, wherein a height of a top surface of the first resin layer is the same as a height of a top surface of the light emitting chip.

18. The light emitting device of claim 16, wherein a top surface of the first resin layer is located at a higher than a top surface of the protective chip.

19. The light emitting device of claim 16, wherein the light emitting chip comprises:
a light emitting structure layer including a first conductive semiconductor layer, an active layer and a second conductive semiconductor layer;
a first electrode layer on the light emitting structure layer;
a reflective layer on the first electrode layer;
a second electrode layer on the reflective layer;
a second electrode disposed on the second electrode layer corresponding to the first bonding part of the first lead electrode;
a plurality of recesses exposed the first conductive semiconductor layer in the light emitting structure layer;
an insulating layer in the recesses and on a part of the second electrode layer; and
a plurality of first electrodes disposed on the insulating layer corresponding to the second bonding part of the second lead electrode.

20. The light emitting device of claim 19, wherein the first electrodes of the light emitting chip are spaced apart from each other and a part of the second electrode is disposed among the first electrodes.

* * * * *